United States Patent
Lee

(10) Patent No.: US 9,368,705 B2
(45) Date of Patent: Jun. 14, 2016

(54) LED PACKAGING STRUCTURE AND METHOD FOR MANUFACTURING THE SAME

(71) Applicant: Lextar Electronics Corporation, Hsinchu (TW)

(72) Inventor: Tzu-Lung Lee, Miaoli (TW)

(73) Assignee: LEXTAR ELECTRONICS CORPORATION, Hsinchu (TW)

(*) Notice: Subject to any disclaimer, the term of this patent is extended or adjusted under 35 U.S.C. 154(b) by 0 days.

(21) Appl. No.: 14/289,112

(22) Filed: May 28, 2014

(65) Prior Publication Data

US 2015/0060915 A1  Mar. 5, 2015

(30) Foreign Application Priority Data

Sep. 2, 2013  (TW) .............................. 102131589 A

(51) Int. Cl.
| | |
|---|---|
| H01L 33/00 | (2010.01) |
| H01L 21/00 | (2006.01) |
| H01L 33/62 | (2010.01) |
| H01L 33/48 | (2010.01) |

(52) U.S. Cl.
CPC ............ *H01L 33/62* (2013.01); *H01L 33/0054* (2013.01); *H01L 33/0079* (2013.01); *H01L 33/486* (2013.01); *H01L 2933/0033* (2013.01)

(58) Field of Classification Search
CPC ................. H01L 2924/12041; H01L 33/24; H01L 31/035281; H01L 25/167; H01L 2933/0041; H01L 33/387; H01L 33/42; H01L 2251/5323; H01L 27/32; H01L 31/125; H01L 31/173; H01L 51/5234; G02B 6/4246; G02B 6/4295

See application file for complete search history.

(56) References Cited

U.S. PATENT DOCUMENTS

| | | | |
|---|---|---|---|
| 2002/0149015 A1* | 10/2002 | Choi ........................ | H01L 27/15 257/59 |
| 2013/0037842 A1* | 2/2013 | Yamada ................... | H01L 33/60 257/98 |

FOREIGN PATENT DOCUMENTS

| | | |
|---|---|---|
| TW | I239670 | 9/2005 |
| TW | I240431 | 9/2005 |
| TW | I265643 | 11/2006 |
| TW | M332942 | 5/2008 |
| TW | I390703 | 3/2013 |

* cited by examiner

*Primary Examiner* — Su C Kim
*Assistant Examiner* — Junaiden Mirsalahuddin
(74) *Attorney, Agent, or Firm* — Moser Taboada

(57) ABSTRACT

A light-emitting diode (LED) packaging structure is provided, which includes a LED stacked layer, a first silicon substrate and a second silicon substrate. The first and second silicon substrates are respectively disposed on two opposite surfaces of the LED stacked layer. The first and second silicon substrates respectively have at least one first hollow portion and at least one second hollow portion, so as to expose the surfaces of a portion of the LED stacked layer. Light emitted by a light-emitting layer may go out through the first and second hollow portions. A method for manufacturing the LED packaging structure is also provided.

11 Claims, 7 Drawing Sheets

LED PACKAGING STRUCTURE AND METHOD FOR MANUFACTURING THE SAME

RELATED APPLICATIONS

This application claims priority to Taiwan Application Serial Number 102131589, filed Sep. 2, 2013, which is herein incorporated by reference.

BACKGROUND

1. Field of Invention

The present disclosure relates to a light-emitting diode (LED) packaging structure, and more particularly, to a bi-directional LED packaging structure.

2. Description of Related Art

A conventional light-emitting diode (LED) structure is usually formed on a transparent substrate, such as a sapphire substrate, and thus to form a LED die. The transparent substrate of the LED has a reflective layer, which is used to reflect light in the transparent substrate to the outside.

In another aspect, a typical bi-directional LED refers to at least two LED dies connected back-to-back to emit light from two opposite surfaces. However, the bi-directional LED tends to have a large packaging structure volume, and methods for manufacturing the same are complicated. As such, the bi-directional LED is not easy to integrate with or apply in a light-emitting device with a small volume, and production cost of the bi-directional LED cannot be reduced.

Therefore, there is a need for a novel LED packaging structure and a method for manufacturing the same to solve the problems of the typical bi-directional LED packaging structure.

SUMMARY

The present disclosure provides a light-emitting diode (LED) packaging structure and a method for manufacturing the same to solve problems of a conventional packaging structure and to minimize the whole LED packaging structure and thus to increase application fields of the LED.

An aspect of the present disclosure is to provide a LED packaging structure, which includes a LED stacked layer, a first silicon substrate and a second silicon substrate. The LED stacked layer sequentially includes a first type semiconductor layer, a light-emitting layer and a second type semiconductor layer. The first silicon substrate is disposed on the first type semiconductor layer and electrically connected to the LED stacked layer, in which the first silicon substrate has at least one first hollow portion to expose a surface of a portion of the first type semiconductor layer. The second silicon substrate is disposed on the second type semiconductor layer and electrically connected to the LED stacked layer, in which the second silicon substrate has at least one second hollow portion to expose a surface of a portion of the second type semiconductor layer. Light emitted by the light-emitting layer may go out through the first and second hollow portions.

According to one embodiment of the present disclosure, the first and second silicon substrates are conductive silicon substrates.

According to one embodiment of the present disclosure, the first and second type semiconductor layers in sequence are n-type and p-type semiconductors, or p-type and n-type semiconductors.

According to one embodiment of the present disclosure, the LED packaging structure further includes a plurality of electrodes respectively electrically connected to the first silicon substrate and/or the second silicon substrate.

According to one embodiment of the present disclosure, the LED packaging structure further includes a bonding layer interposed between the first type semiconductor layer and the first silicon substrate and/or between the second type semiconductor layer and the second silicon substrate.

According to one embodiment of the present disclosure, the bonding layer includes a metal layer or a transparent conductive layer.

According to one embodiment of the present disclosure, the transparent conductive layer includes indium tin oxide (ITO), indium zinc oxide (IZO), graphene or carbon nanotube.

According to one embodiment of the present disclosure, the LED packaging structure further includes an encapsulant disposed in the first and second hollow portions.

According to another embodiment of the present disclosure, the encapsulant further includes a wavelength conversion material.

According to further embodiment of the present disclosure, the wavelength conversion material is a fluorescent powder, dye, pigment or combination thereof.

According to one embodiment of the present disclosure, the LED packaging structure further includes a reflective layer disposed on sidewalls of the first and second hollow portions.

Another aspect of the present disclosure is to provide a method for manufacturing a LED packaging structure. The method includes: providing a first silicon substrate and a LED stacked layer on the first silicon substrate, and the LED stacked layer sequentially includes a first type semiconductor layer, a light-emitting layer and a second type semiconductor layer; providing a second silicon substrate covering the second type semiconductor layer of the LED stacked layer; forming at least one first hollow portion in the first silicon substrate to expose a surface of a portion of the first type semiconductor layer; and forming at least one second hollow portion in the second silicon substrate to expose a surface of a portion of the second type semiconductor layer.

According to one embodiment of the present disclosure, the first and second silicon substrates are conductive silicon substrates.

According to one embodiment of the present disclosure, the first and second type semiconductor layers in sequence are n-type and p-type semiconductors, or p-type and n-type semiconductors.

According to one embodiment of the present disclosure, the method further includes forming a plurality of electrodes on the first silicon substrate and/or the second silicon substrate.

According to one embodiment of the present disclosure, the method further includes forming a bonding layer between the first type semiconductor layer and the first silicon substrate and/or between the second type semiconductor layer and the second silicon substrate.

According to one embodiment of the present disclosure, the bonding layer includes a metal layer or a transparent conductive layer.

According to one embodiment of the present disclosure, the transparent conductive layer includes ITO, IZO, graphene or carbon nanotube.

According to one embodiment of the present disclosure, the method further includes filling an encapsulant in the first and second hollow portions.

According to another embodiment of the present disclosure, the encapsulant further includes a wavelength conversion material.

According to further embodiment of the present disclosure, the wavelength conversion material is a fluorescent powder, dye, pigment or combination thereof.

According to one embodiment of the present disclosure, the method further includes forming a reflective layer on sidewalls of the first and second hollow portions.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Figure 1A:
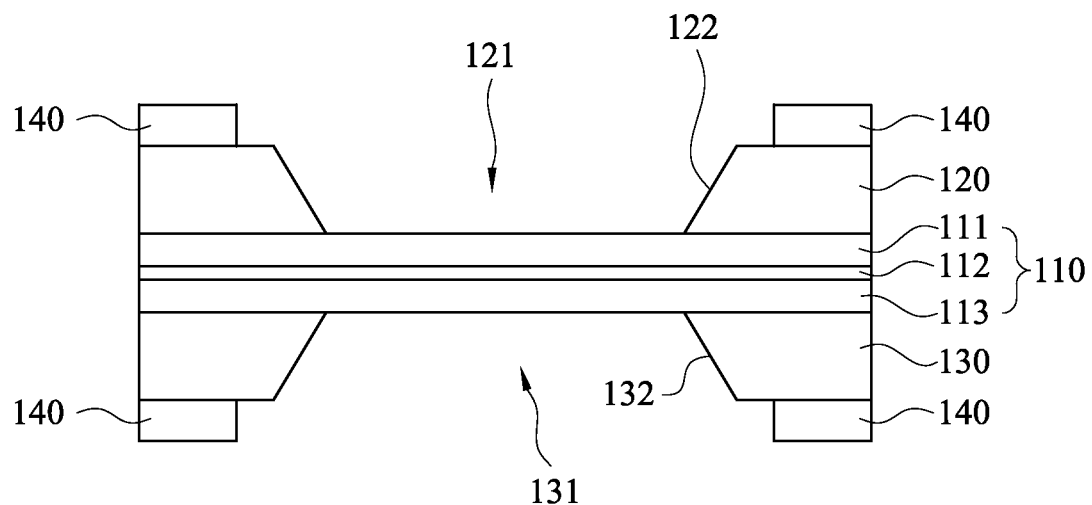
FIGS. 1A-1D are cross-sectional views of light-emitting diode (LED) packaging structures 100a-100d according to various embodiments of the present disclosure.

FIGS. 1A-1D are cross-sectional views of light-emitting diode (LED) packaging structures 100a-100d according to various embodiments of the present disclosure. As shown in FIG. 1A, the packaging structure 100a includes a LED stacked layer 110, a first silicon substrate 120 and a second silicon substrate 130.

The LED stacked layer 110 sequentially includes a first type semiconductor layer 111, a light-emitting layer 112 and a second type semiconductor layer 113. In one embodiment of the present disclosure, the first type semiconductor layer 111 is an n-type semiconductor, and the second type semiconductor layer 113 is a p-type semiconductor. In another embodiment of the present disclosure, the first type semiconductor layer 111 is a p-type semiconductor, and the second type semiconductor layer 113 is an n-type semiconductor.

The first silicon substrate 120 is disposed on the first type semiconductor layer 111 and electrically connected to the LED stacked layer 110. The first silicon substrate 120 has at least one first hollow portion 121 to expose a surface of a portion of the first type semiconductor layer 111. In one embodiment of the present disclosure, the first silicon substrate 120 is a conductive silicon substrate.

The second silicon substrate 130 is disposed on the second type semiconductor layer 113 and electrically connected to the LED stacked layer 110. The second silicon substrate 130 has at least one second hollow portion 131 to expose a surface of a portion of the second type semiconductor layer 113. In one embodiment of the present disclosure, the second silicon substrate 130 is a conductive silicon substrate.

As shown in FIG. 1A, the packaging structure 100a further includes a plurality of electrodes 140 respectively electrically connected to the first silicon substrate 120 and the second silicon substrate 130. According to one embodiment of the present disclosure, the electrodes are only electrically connected to the first silicon substrate or the second silicon substrate. Further, a reflective layer is included, which is disposed on a sidewall 122 of the first hollow portion 121 of the first silicon substrate 120 and a sidewall 132 of the second hollow portion 131 of the second silicon substrate 130, so as to enhance light extraction efficiency.

When the packaging structure 100a is connected to an external power supply, light emitted by the light-emitting layer 112 may go through the first type semiconductor layer 120 or the second type semiconductor layer 130 and then go out from the first hollow portion 121 or the second hollow portion 131.

Figure 1B:
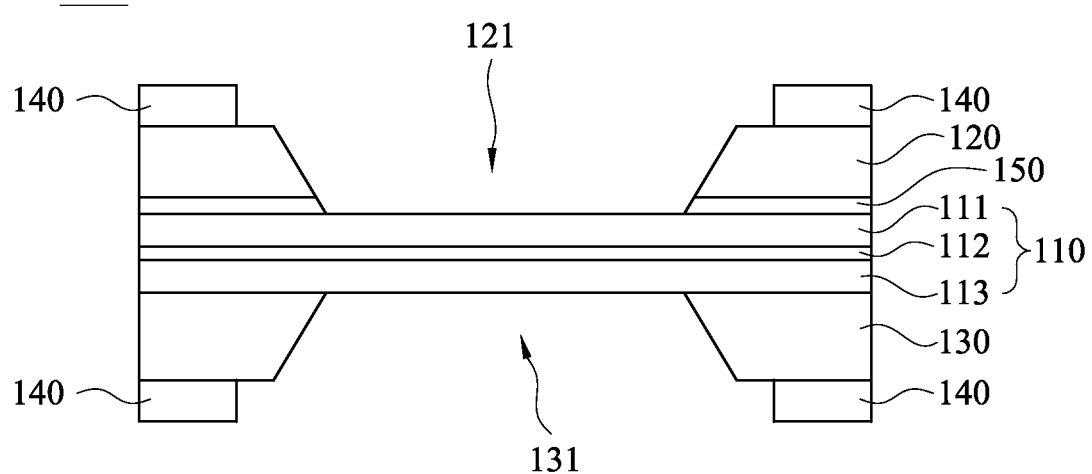

FIG. 1B is a LED packaging structure 100b according to one embodiment of the present disclosure. The packaging structure 100b includes a LED stacked layer 110, a first silicon substrate 120, a second silicon substrate 130 and a plurality of electrodes 140.

As shown in FIG. 1B, the LED stacked layer 110 sequentially includes a first type semiconductor layer 111, a light-emitting layer 112 and a second type semiconductor layer 113. The first silicon substrate 120 is disposed on the first type semiconductor layer 111 and electrically connected to the LED stacked layer 110. The first silicon substrate 120 has at least one first hollow portion 121 to expose a surface of a portion of the first type semiconductor layer 111. The second silicon substrate 130 is disposed on the second type semiconductor layer 113 and electrically connected to the LED stacked layer 110. The second silicon substrate 130 has at least one second hollow portion 131 to expose a surface of a portion of the second type semiconductor layer 113. The electrodes 140 are respectively electrically connected to the first silicon substrate 120 and the second silicon substrate 130.

The difference between the embodiment of FIG. 1B and that of FIG. 1A is that the packaging structure 110b of FIG. 1B further includes a bonding layer 150 interposed between the first type semiconductor layer 111 and the first silicon substrate 120. In one embodiment of the present disclosure, the bonding layer is interposed between the second type semiconductor layer and the second silicon substrate. In another embodiment of the present disclosure, the bonding layers are respectively interposed between the first type semiconductor layer and the first silicon substrate and between the second type semiconductor layer and the second silicon substrate. According to one embodiment of the present disclosure, the bonding layer 150 includes a metal layer or a transparent conductive layer, in which the transparent conductive layer may be made of indium tin oxide (ITO), indium zinc oxide (IZO), graphene or carbon nanotube, but not limited thereto.

As shown in FIG. 1B, the bonding layer 150 and the first silicon substrate 120 have a same pattern. However, in another embodiment of the present disclosure, the bonding layer fully covers the surface of the first type semiconductor layer, and the first silicon substrate is disposed on the bonding layer. A surface of a portion of the bonding layer is exposed from the first hollow portion.

Figure 1C:
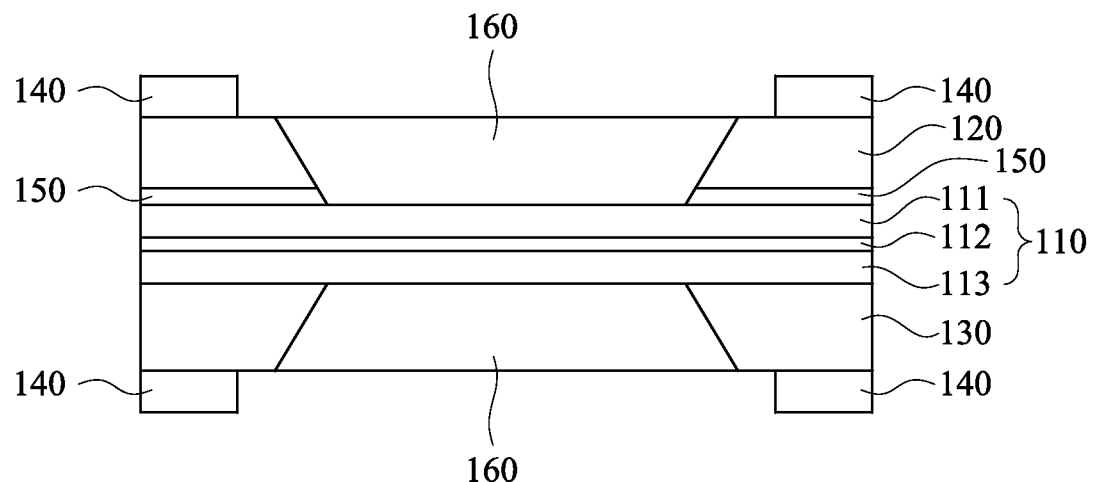

FIG. 1C is a LED packaging structure 100c according to one embodiment of the present disclosure. As shown in FIG. 1C, the packaging structure 100c includes a LED stacked layer 110, a first silicon substrate 120, a second silicon substrate 130, a plurality of electrodes 140 and a bonding layer 150.

As shown in FIG. 1C, the LED stacked layer 110 sequentially includes a first type semiconductor layer 111, a light-emitting layer 112 and a second type semiconductor layer 113. The first silicon substrate 120 is disposed on the first type semiconductor layer 111 and electrically connected to the LED stacked layer 110. The first silicon substrate 120 has at least one first hollow portion 121 to expose a surface of a portion of the first type semiconductor layer 111. The second silicon substrate 130 is disposed on the second type semiconductor layer 113 and electrically connected to the LED stacked layer 110. The second silicon substrate 130 has at least one second hollow portion 131 to expose a surface of a portion of the second type semiconductor layer 113. The electrodes 140 are respectively electrically connected to the first silicon substrate 120 and the second silicon substrate 130. The bonding layer 150 is interposed between the first silicon substrate 120 and the first type semiconductor layer 111.

The difference between the embodiment of FIG. 1C and that of FIG. 1B is that the packaging structure 100c of FIG. 1C further includes an encapsulant 160 disposed in the first hollow portion 121 and the second hollow portion 131. In one embodiment of the present disclosure, the encapsulant is only disposed in the first hollow portion 121 or the second hollow portion 131. According to one embodiment of the present disclosure, the encapsulant 160 includes a transparent packaging adhesive, such as transparent silicone or transparent plastics, but not limited thereto.

Figure 1D:
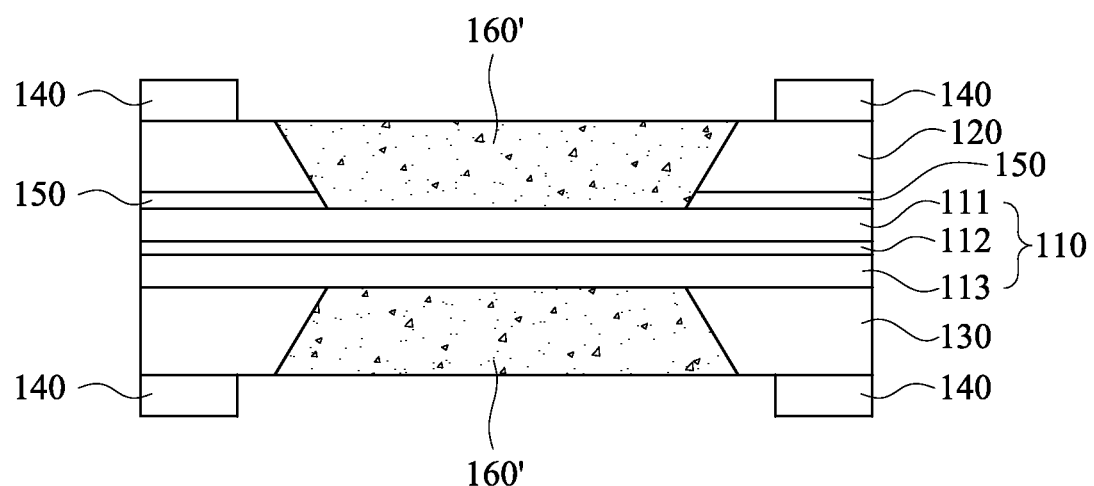

FIG. 1D is a LED packaging structure 100d according to one embodiment of the present disclosure. As shown in FIG. 1D, the packaging structure 100d includes a LED stacked layer 110, a first silicon substrate 120, a second silicon substrate 130, a plurality of electrodes 140, a bonding layer 150 and an encapsulant 160'.

As shown in FIG. 1D, the LED stacked layer 110 sequentially includes a first type semiconductor layer 111, a light-emitting layer 112 and a second type semiconductor layer 113. The first silicon substrate 120 is disposed on the first type semiconductor layer 111 and electrically connected to the LED stacked layer 110. The first silicon substrate 120 has at least one first hollow portion 121 to expose a surface of a portion of the first type semiconductor layer 111. The second silicon substrate 130 is disposed on the second type semiconductor layer 113 and electrically connected to the LED stacked layer 110. The second silicon substrate 130 has at least one second hollow portion 131 to expose a surface of a portion of the second type semiconductor layer 113. The electrodes 140 are respectively electrically connected to the first silicon substrate 120 and the second silicon substrate 130. The bonding layer 150 is interposed between the first silicon substrate 120 and the first type semiconductor layer 111. The encapsulant 160' is disposed in the first hollow portion 121 and the second hollow portion 131.

The difference between the embodiment of FIG. 1D and that of FIG. 1C is that the encapsulant 160' further includes a wavelength conversion material uniformly dispersed in the transparent packaging adhesive. The wavelength conversion material may be a fluorescent powder, dye, pigment or combination thereof, but not limited thereto.

Figure 2:
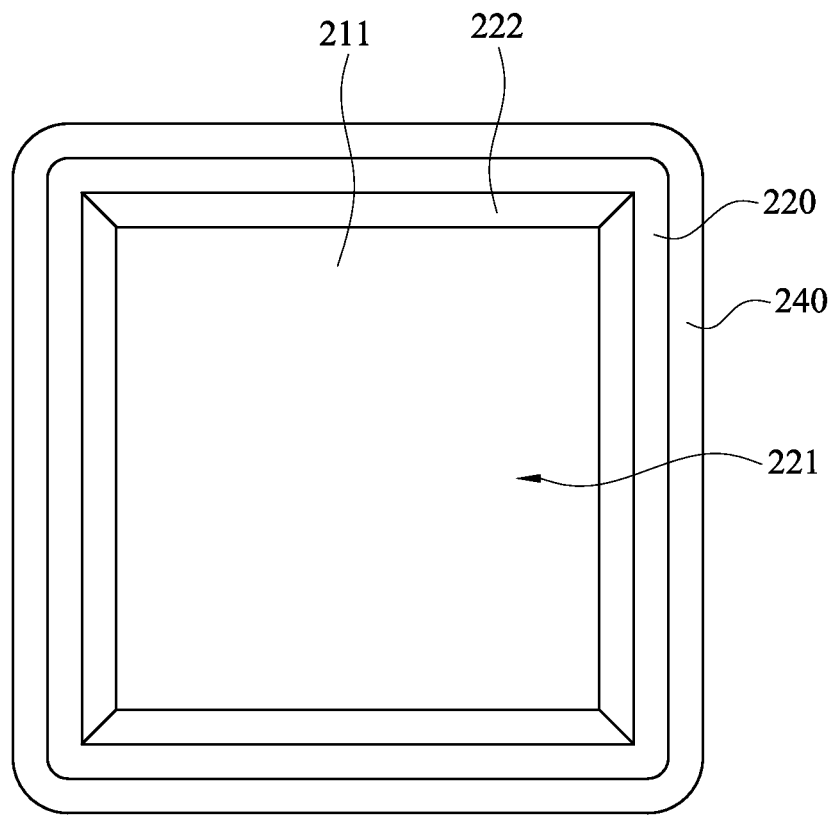
FIG. 2 is a top view of a LED packaging structure 200 according to one embodiment of the present disclosure.

FIG. 2 is a top view of a LED packaging structure 200 according to one embodiment of the present disclosure. As shown in FIG. 2, the packaging structure 200 includes a first type semiconductor layer 211, a first silicon substrate 220 and an electrode 240.

The first silicon substrate 220 is disposed on the first type semiconductor layer 211. The first silicon substrate 220 has at least one first hollow portion 221 to expose a surface of a portion of the first type semiconductor layer 211. The electrode 240 is disposed on the first silicon substrate 220 and in a ring structure surrounding the first hollow portion 221. When an external power supply is connected to the electrode 240, light emitted by the light-emitting layer (not shown) may go out through the first hollow portion 221. It is noteworthy that the second silicon substrate (not shown) and the first silicon substrate 220 may have the same or similar structural features. In addition, as shown in FIG. 2, a reflective layer is included, which is disposed on a sidewall 222 of the first hollow portion 221 of the first silicon substrate 220, and thus to increase light extraction efficiency.

FIGS. 3A-3I are cross-sectional views at various stages of manufacturing a LED packaging structure 300 according to various embodiments of the present disclosure.

Figure 3A:
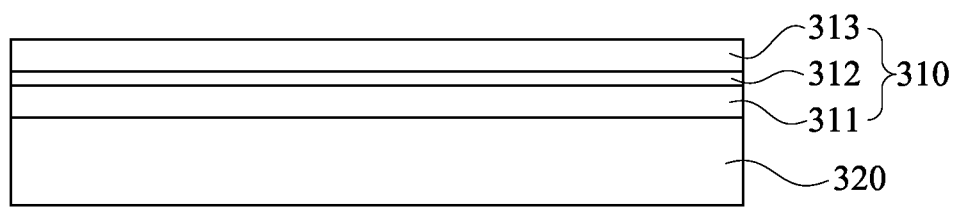
FIGS. 3A-3I are cross-sectional views at various stages of manufacturing a LED packaging structure 300 according to various embodiments of the present disclosure.

As shown in FIG. 3A, a first silicon substrate 320 and a LED stacked layer 310 disposed thereon are provided. The LED stacked layer 310 sequentially includes a first type semiconductor layer 311, a light-emitting layer 312 and a second type semiconductor layer 313. The first silicon substrate 320 is in contact with the first type semiconductor layer 311 and electrically connected to the LED stacked layer 310. In one embodiment of the present disclosure, the first type semiconductor layer 311 and the second type semiconductor layer 313 in sequence are n-type and p-type semiconductors, or p-type and n-type semiconductors.

Figure 3B:
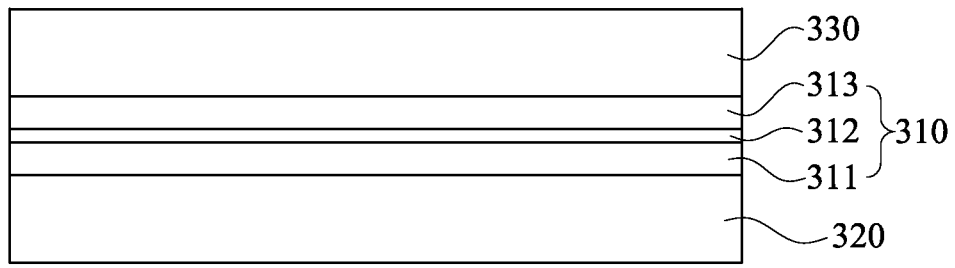

Next, a second silicon substrate 330 is provided, which covers the second type semiconductor layer 313 of the LED stacked layer 310, as shown in FIG. 3B. In one embodiment of the present disclosure, the first silicon substrate 320 and the second silicon substrate 330 are conductive silicon substrates.

Figure 3C:
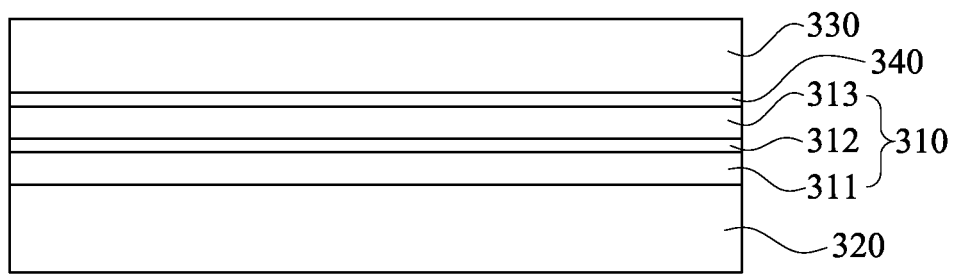

According to one embodiment of the present disclosure, the method further includes forming a bonding layer between the first type semiconductor layer and the first silicon substrate and/or the second type semiconductor layer and the second silicon substrate. As shown in FIG. 3C, a bonding layer 340 is formed between the second type semiconductor layer 313 and the second silicon substrate 330. In one embodiment of the present disclosure, the bonding layer 340 includes a metal layer or a transparent conductive layer. The transparent conductive layer includes ITO, IZO, graphene or carbon nanotube, but not limited thereto.

Figure 3D:
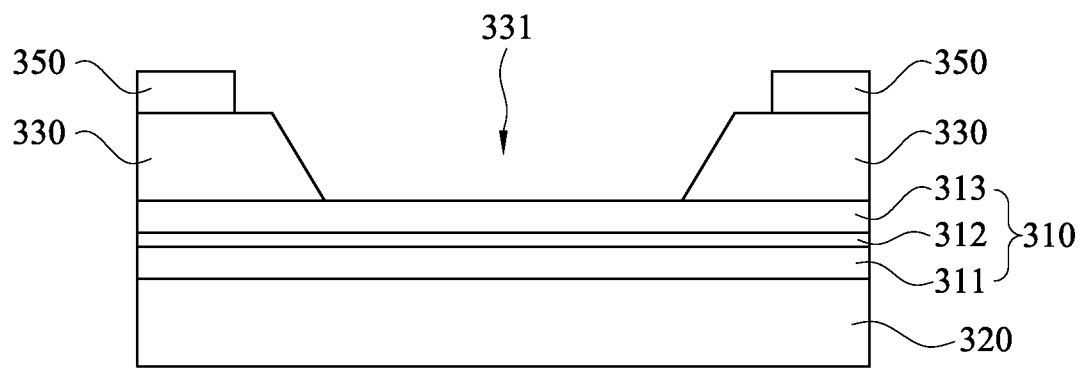

As shown in FIG. 3D, which follows FIG. 3B, a second hollow portion 331 is formed in the second silicon substrate 330 to expose a surface of a portion of the second type semiconductor layer 313, and a plurality of electrodes 350 are formed on the second silicon substrate 330. The method for forming the second hollow portion 331 includes dry or wet etching. In one embodiment of the present disclosure, a photoresist is formed on a surface of a silicon substrate by a photolithography process, and an etch process is then performed to form a patterned hollow portion.

Figure 3E:
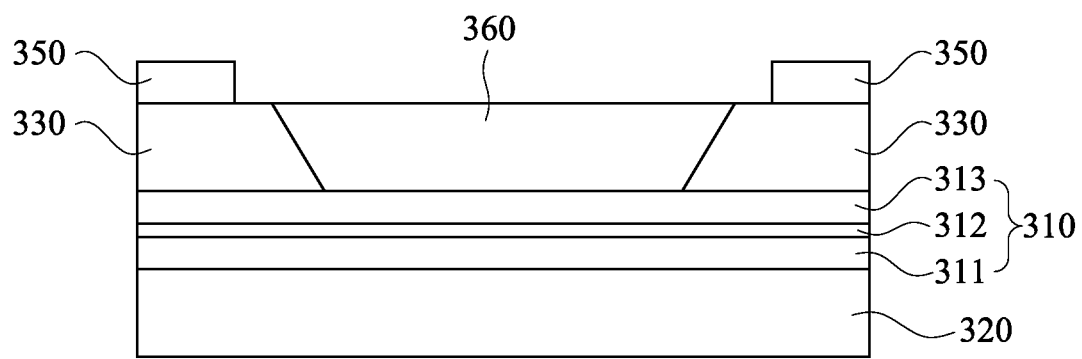

Subsequently, an encapsulant 360 may be directly filled in the first hollow portion 331 of FIG. 3D, as shown in FIG. 3E. The encapsulant 360 of FIG. 3E includes a transparent packaging adhesive, such as transparent silicone or transparent plastics, but not limited thereto. In one embodiment of the present disclosure, the method for filling the encapsulant 360 includes coating or dispensing.

Figure 3F:
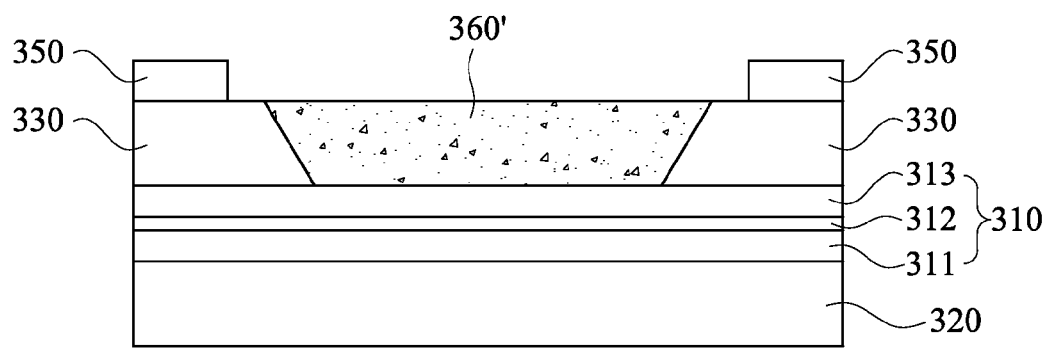

The difference between the embodiment of FIG. 3F and that of FIG. 3E is that the encapsulant 360' of FIG. 3F further includes a wavelength conversion material uniformly dispersed in the transparent packaging adhesive. The wavelength conversion material may be a fluorescent powder, dye, pigment or combination thereof, but not limited thereto.

Figure 3G:
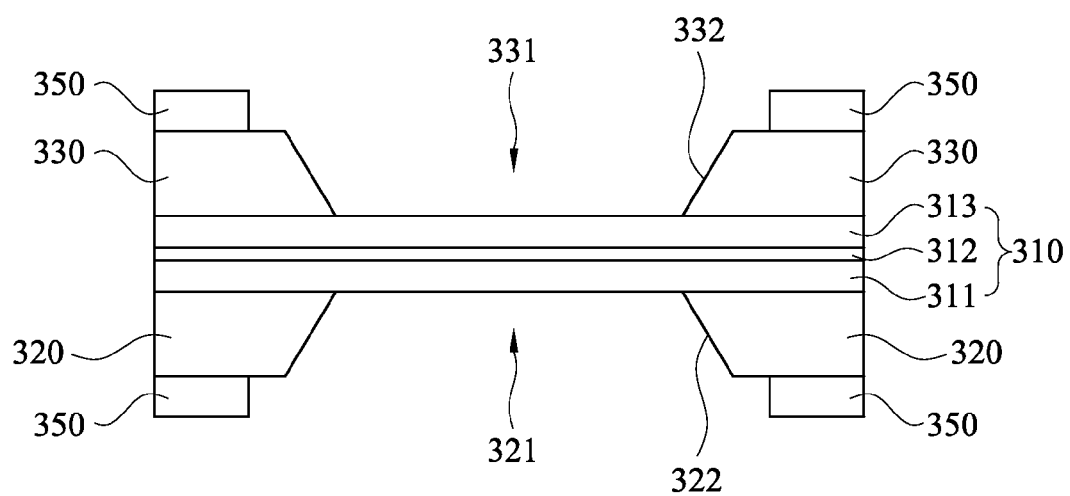

Furthermore, as shown in FIG. 3G, which follows FIG. 3D, at least one first hollow portion 321 is formed in the first silicon substrate 320 to expose a surface of a portion of the first type semiconductor layer 311, and a plurality of electrodes 350 are formed on the first silicon substrate 320, so as to form the LED packaging structure. Forming the first hollow portion 321 is conducted by an etch process. As shown in FIG. 3G, a reflective layer is included, which is disposed on a sidewall 322 of the first hollow portion 321 of the first silicon substrate 320 and a sidewall 332 of the second hollow portion 331 of the second silicon substrate 330, so as to increase light extraction efficiency.

Figure 3H:
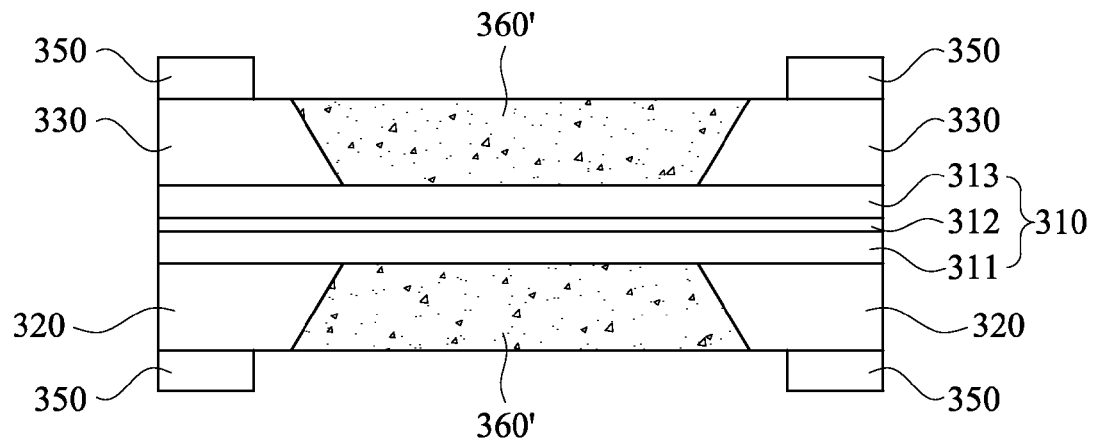

The difference between the embodiment of FIG. 3H and that of FIG. 3G is that the packaging structure of FIG. 3H further includes filling an encapsulant 360' in the first hollow portion 321 and the second hollow portion 331 of FIG. 3G. In the embodiment, the color of the light emitted adjacent to the first silicon substrate 320 is the same as that emitted adjacent to the second silicon substrate 330, such that it can be applied in a monochromatic LED light-emitting device. The encapsulant 360' includes a wavelength conversion material uniformly dispersed in the transparent packaging adhesive. The wavelength conversion material may be a fluorescent powder, dye, pigment or combination thereof, but not limited thereto.

Figure 3I:
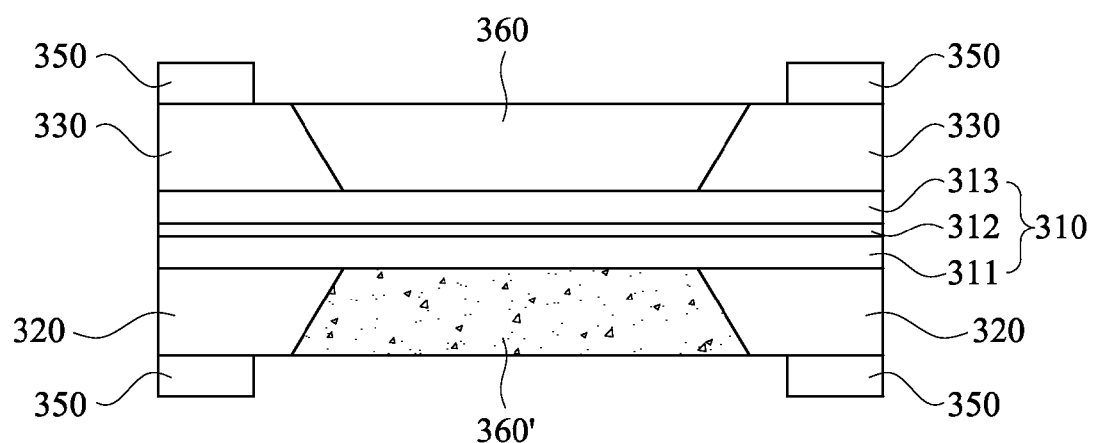

In another embodiment of the present disclosure, the encapsulant 360' may be filled in the first hollow portion 321 of FIG. 3G, and the encapsulant 360 may be filled in the second hollow portion 331 of FIG. 3G, as shown in FIG. 3I. The encapsulant 360 is composed of a transparent packaging adhesive, and the encapsulant 360' includes a wavelength conversion material dispersed in the transparent packaging adhesive. In the embodiment, the color of the light emitted adjacent to the first silicon substrate 320 is different from that emitted adjacent to the second silicon substrate 330, such that it can be applied in a polychromatic LED light-emitting device.

In the embodiments of the present disclosure, the LED packaging structure has at least two hollow portions disposed on opposite sides, such that it can emit bi-directional light. Moreover, the bi-directional LED provided by the embodiments of the present disclosure emits light by only the LED stacked layer. The LED stacked layer and two conductive silicon substrates positioned on opposite sides thereof construct the LED packaging structure. Accordingly, the packaging structure provided by the embodiments of the present disclosure has a smaller packaging structure volume and thus can be applied in various types of light-emitting devices.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light-emitting diode (LED) packaging structure, comprising:
    a LED stacked layer comprising a first type semiconductor layer, a second type semiconductor layer beneath the first type semiconductor layer and a light-emitting layer between the first type semiconductor layer and the second type semiconductor layer;
    a first silicon substrate disposed on the first type semiconductor layer and electrically connected to the LED stacked layer, wherein the first silicon substrate has at least one first hollow portion through the first silicon substrate to expose a surface of a portion of the first type semiconductor layer; and
    a second silicon substrate disposed beneath the second type semiconductor layer and electrically connected to the LED stacked layer, wherein the second silicon substrate has at least one second hollow portion through the second silicon substrate to expose a surface of a portion of the second type semiconductor layer,
    wherein the LED stacked layer is between the first silicon substrate and the second silicon substrate, and light emitted by the light-emitting layer goes out through the first and second hollow portions.

2. The LED packaging structure of claim 1, wherein the first and second silicon substrates are conductive silicon substrates.

3. The LED packaging structure of claim 2, wherein the first and second type semiconductor layers are n-type and p-type semiconductors, or p-type and n-type semiconductors respectively.

4. The LED packaging structure of claim 3, further comprising a plurality of electrodes respectively electrically connected to the first silicon substrate and/or the second silicon substrate.

5. The LED packaging structure of claim 1, further comprising a bonding layer interposed between the first type semiconductor layer and the first silicon substrate and/or between the second type semiconductor layer and the second silicon substrate.

6. The LED packaging structure of claim 5, wherein the bonding layer comprises a metal layer or a transparent conductive layer.

7. The LED packaging structure of claim 6, wherein the transparent conductive layer comprises indium tin oxide (ITO), indium zinc oxide (IZO), graphene or carbon nanotube.

8. The LED packaging structure of claim 7, further comprising an encapsulant disposed in the first and second hollow portions.

9. The LED packaging structure of claim 8, wherein the encapsulant further comprises a wavelength conversion material.

10. The LED packaging structure of claim 9, wherein the wavelength conversion material is a fluorescent powder, dye, pigment or combination thereof.

11. The LED packaging structure of claim 1, further comprising a reflective layer disposed on sidewalls of the first and second hollow portions.

* * * * *